US008614903B2

(12) United States Patent
Tsuchiya et al.

(10) Patent No.: US 8,614,903 B2
(45) Date of Patent: Dec. 24, 2013

(54) POWER CONDITIONER FOR PHOTOVOLTAIC POWER GENERATION

(75) Inventors: Taichiro Tsuchiya, Tokyo (JP); Akihiko Iwata, Tokyo (JP); Tomoyuki Kawakami, Tokyo (JP); Tatsuya Okuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 179 days.

(21) Appl. No.: 13/386,710

(22) PCT Filed: Jul. 14, 2010

(86) PCT No.: PCT/JP2010/004567
§ 371 (c)(1),
(2), (4) Date: Jan. 24, 2012

(87) PCT Pub. No.: WO2011/024374
PCT Pub. Date: Mar. 3, 2011

(65) Prior Publication Data
US 2012/0120694 A1    May 17, 2012

(30) Foreign Application Priority Data

Aug. 24, 2009   (JP) ................................. 2009-192903

(51) Int. Cl.
*H02M 7/515* (2007.01)
(52) U.S. Cl.
USPC ............................................ 363/97; 323/906
(58) Field of Classification Search
USPC ............ 363/16, 17, 95, 97, 98, 131; 323/207, 323/906
See application file for complete search history.

(56) References Cited

U.S. PATENT DOCUMENTS 6,031,736 A *   2/2000   Takehara et al. ................ 363/98
6,963,147 B2   11/2005   Kurokami et al.
(Continued)

FOREIGN PATENT DOCUMENTS

JP        11 308871        11/1999
JP       2001 275259       10/2001
(Continued)

OTHER PUBLICATIONS

Dhere, N.G., et al., "High-Voltage Bias Testing of Thin-Film PV Modules," 3$^{rd}$ World Conference on Photovoltaic Energy Conversion, pp. 1923-1926, (May 11-18, 2003).

(Continued)

*Primary Examiner* — Adolf Berhane
(74) *Attorney, Agent, or Firm* — Oblon, Spivak, McClelland, Maier & Neustadt, L.L.P.

(57) ABSTRACT

Power generated by a solar battery of thin-film type is stepped up to a predetermined DC voltage by a step-up chopper circuit, and the predetermined DC voltage is converted into three-phase AC power by an inverter circuit, and the three-phase AC power is supplied to an AC power supply system via an output DC voltage circuit. The solar battery is not grounded, and a negative electrode thereof has a floating capacitance between the negative electrode and the ground. The AC power supply system is configured by three-phase star-connection, and the neutral point is grounded. The output DC voltage circuit includes three batteries, and the batteries are provided, for the respective phases, between the AC power supply system and a sine wave filter connected to the AC output side of the inverter circuit. Therefore, it is possible to prevent acceleration of the deterioration of the solar battery.

9 Claims, 9 Drawing Sheets

(56) References Cited

U.S. PATENT DOCUMENTS

| | | |
|---|---|---|
| 7,079,406 B2 | 7/2006 | Kurokami et al. |
| 7,126,294 B2 * | 10/2006 | Minami et al. ................ 318/139 |
| 7,596,008 B2 | 9/2009 | Iwata et al. |
| 7,602,626 B2 | 10/2009 | Iwata et al. |
| 7,706,164 B2 * | 4/2010 | Nishi et al. ................... 363/146 |
| 7,719,865 B2 | 5/2010 | Iwata et al. |
| 7,834,485 B2 * | 11/2010 | Park .............................. 307/117 |
| 7,924,582 B2 * | 4/2011 | Muller et al. ............. 363/56.05 |
| 8,189,352 B2 * | 5/2012 | Egiziano et al. ................ 363/35 |
| 8,315,076 B2 * | 11/2012 | Schmidt et al. ............... 363/132 |
| 8,335,090 B2 * | 12/2012 | Huang et al. ................... 363/17 |
| 8,379,418 B2 * | 2/2013 | Falk ................................ 363/49 |
| 8,405,367 B2 * | 3/2013 | Chisenga et al. ............. 323/207 |
| 2011/0148195 A1 * | 6/2011 | Lee ................................ 307/25 |

FOREIGN PATENT DOCUMENTS

| | | |
|---|---|---|
| JP | 2004 297999 | 10/2004 |
| JP | 2008 47819 | 2/2008 |

OTHER PUBLICATIONS

International Search Report Issued Sep. 28, 2010 in PCT/JP10/04567 Filed Jul. 14, 2010.

* cited by examiner

OPERATION MODE 1

OPERATION MODE 2

OPERATION MODE 3

OPERATION MODE 4

POWER CONDITIONER FOR PHOTOVOLTAIC POWER GENERATION

TECHNICAL FIELD

The present invention relates to improvements in a power conditioner for photovoltaic power generation.

BACKGROUND ART

A power conditioner for photovoltaic power generation which coordinates a solar battery with an AC power supply system has a function of converting DC power generated by the solar battery into AC power, and a function of coordinating the solar battery with the AC power supply system. The AC power sent to the AC power supply system is consumed by a load connected to the AC power supply system. For example, a system coordination inverter as a power conditioner for photovoltaic power generation converts DC power inputted from a DC power supply (solar battery) into AC power via a converter circuit and an inverter circuit in which the inputs and outputs are not isolated from each other, and outputs the AC power to an AC power supply system that is grounded (see, for example, Patent Literature 1).

In the above configuration, the solar battery and the AC power supply system are connected in a non-isolated state. In addition, the neutral point of the AC power supply system is grounded. Therefore, the solar battery needs to be isolated from the ground (earth), and as a result, a floating capacitance Cs occurs between the solar battery and the ground. A neutral point voltage of the AC power supply system is almost equal to a DC neutral point voltage of the inverter circuit. Here, if the voltage of a DC capacitor connected to the DC side of the inverter circuit is defined as 2 E (V), the voltage of the floating capacitance Cs (the voltage of a negative electrode N as seen from the ground) is –E (V). That is, the negative electrode N of the solar battery is negatively biased.

Solar batteries are classified into a crystal type and a thin-film type. It has been reported that if a solar battery of thin-film type is used while its negative electrode N is negatively biased, the deterioration of the solar battery is accelerated (see, for example, Non-Patent Literature 1). Therefore, when a solar battery of thin-film type is used, in general, the negative electrode N is grounded. However, the grounding method for the negative electrode N is not applicable to non-isolated systems.

In addition, the following technique is known. In order to suppress the deterioration of a solar battery, an isolating transformer is provided to a power conversion section for converting DC power of the solar battery into AC power so that the solar battery is coordinated with an AC power supply system via the isolating transformer, and a voltage conversion section is provided to shift the voltage against the ground of each of the positive electrode and the negative electrode of the solar battery, to a value larger than 0 (V) (see, for example, Patent Literature 2).

CITATION LIST

Patent Literature

Patent Literature 1: Japanese Laid-Open Patent Publication No. 2001-275259 (paragraph [0027] and FIG. 1)
Patent Literature 2: Japanese Laid-Open Patent Publication No. 2008-047819 (paragraphs [0040] and [0041], and FIGS. 3 and 4)

Non-Patent Literature

Non-Patent Literature 1: Neelkanth et al. "High-Voltage Bias Testing of Thin-Film PV Modules", Poster 1923-1926, 3rd World Conference on Photovoltaic Energy Conversion, May 11-18, 2003, Osaka, Japan Poster 1926, left column, lines 17-31

SUMMARY OF THE INVENTION

Problems to be Solved by the Invention

In the case where a solar battery of thin-film type is used in a non-isolated system, there is fear that the solar battery itself is deteriorated. Therefore, in the case where the solar battery of thin-film type is used, a power conditioner for photovoltaic power generation is configured as an isolated system. In a specific isolating method, an output transformer (isolating transformer) is provided before an AC power supply system, as described above. Since the solar battery and the AC power supply system are isolated from each other by the output transformer, it becomes possible to ground the negative electrode N. However, power loss occurs in the output transformer. Specifically, copper loss occurs in a winding conductor, and iron loss occurs in an iron core. Although a basic function of the power conditioner for photovoltaic power generation is to convert DC power generated by the solar battery into AC power without waste, the loss described above becomes a factor for inhibiting the function. That is, if the acceleration of the deterioration of the solar battery is to be prevented, the negative electrode N needs to be grounded, and in order to coordinate the solar battery with the AC power supply system that is grounded, an output transformer needs to be provided before the AC power supply system. As a result, power loss increases. In addition, ventilation power for discharging heat caused by the loss to the outside is needed. In addition, in general, the size and the weight of output transformers are large, and therefore, there are also problems of cost and implementation.

The present invention has been made to solve the above problems, and an object of the present invention is to provide a power conditioner for photovoltaic power generation that can prevent acceleration of deterioration of a solar battery and reduce power loss.

Means of Solution to the Problems

A power conditioner for photovoltaic power generation according to the present invention is a power conditioner for photovoltaic power generation in which a solar battery is connected, not via isolating means, to an AC power supply system that is grounded. The power conditioner for photovoltaic power generation comprises a power conversion apparatus for converting DC power having a predetermined voltage and generated by the solar battery, into AC power and a bias application apparatus for applying a bias voltage to the solar battery such that a negative electrode of the solar battery does not have a negative potential, the bias application apparatus being provided in series between the power conversion apparatus and the AC power supply system.

Effect of the Invention

According to the present invention, in the power conditioner for photovoltaic power generation, a solar battery is connected, not via isolating means, to an AC power supply system that is grounded. The power conditioner for photovoltaic power generation includes a power conversion apparatus for converting DC power having a predetermined voltage and generated by the solar battery, into AC power and a bias application apparatus for applying a bias voltage to the solar battery such that a negative electrode of the solar battery does not have a negative potential, the bias application apparatus being provided in series between the power conversion apparatus and the AC power supply system. Therefore, it is possible to prevent the acceleration of the deterioration of the solar battery and reduce power loss.

MODE FOR CARRYING OUT THE INVENTION

Embodiment 1

Figure 1:
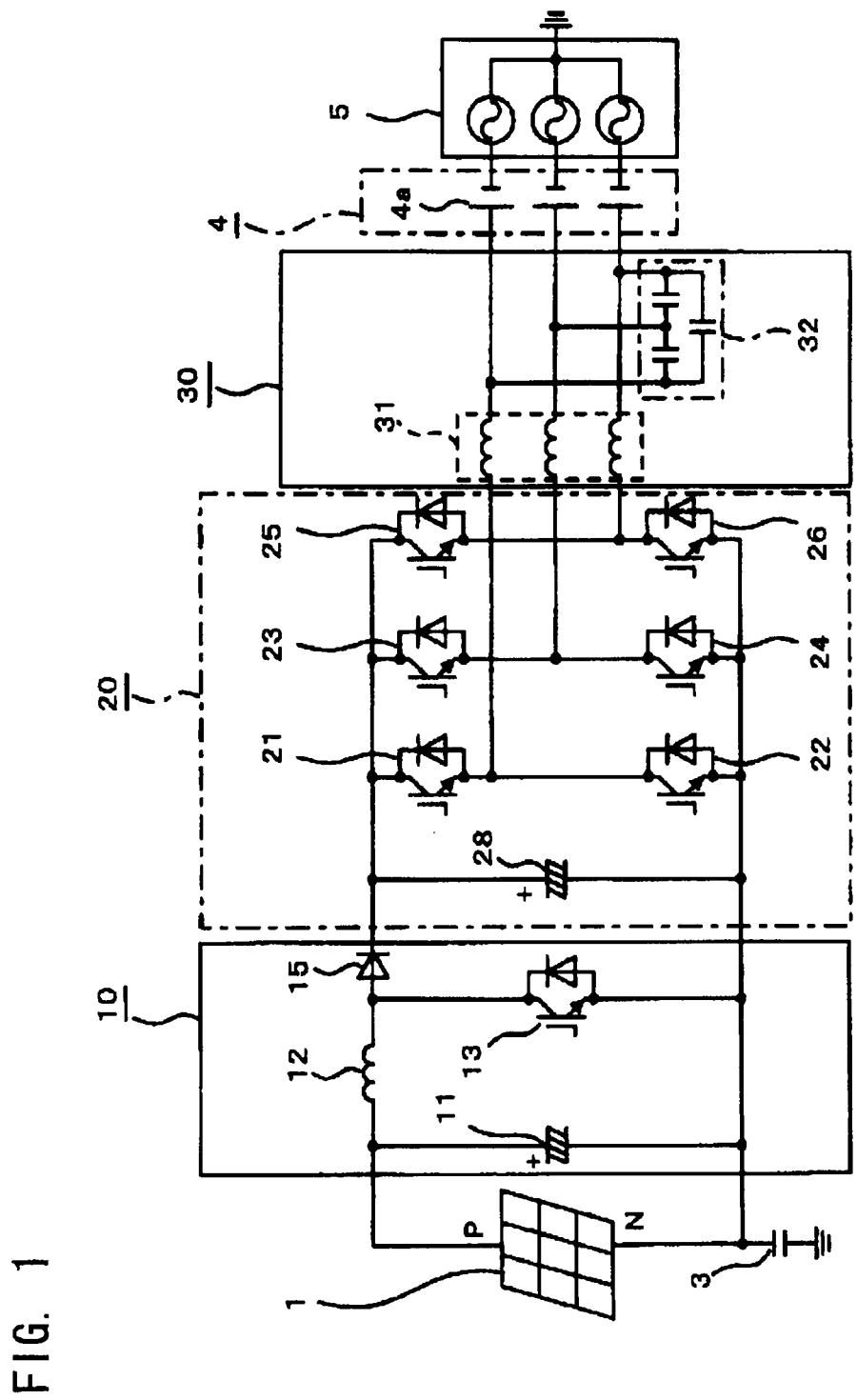
FIG. 1 is a diagram showing the configuration of a power conditioner for photovoltaic power generation according to embodiment 1 of the present invention.

FIG. 1 is a diagram showing the configuration of a power conditioner for photovoltaic power generation according to embodiment 1 of the present invention. With reference to FIG. 1, DC power generated by a solar battery 1 of thin-film type is converted (stepped up) into DC power having a DC voltage of 2 E (V) which is a predetermined voltage, by a step-up chopper circuit 10. The DC power that has been stepped up is converted into three-phase AC power by an inverter circuit 20 which is a power conversion apparatus. The three-phase AC power is sent to an AC power supply system 5 via a sine wave filter 30 and an output DC voltage circuit 4 which is a bias application apparatus. The solar battery 1 is not grounded, and a negative electrode N of the solar battery 1 is grounded via an equivalent capacitor 3 having a floating capacitance Cs between the negative electrode N and the ground. The AC power supply system 5 is a three-phase star-connection AC power supply system in which power supplies for three phases are connected by star-connection, and the neutral point is grounded.

It is noted that the step-up chopper circuit 10 includes an input capacitor 11, a step-up reactor 12, an IGBT device 13, and a diode device 15, and are connected between a positive electrode P and the negative electrode N of the solar battery 1. The inverter circuit 20 is a three-phase 2-level inverter circuit including: IGBT devices 21 to 26 as switching devices, connected as a three-phase full-wave bridge circuit; and a DC capacitor 28. The sine wave filter 30 includes filter reactors 31 and filter capacitors 32. The filter reactors 31 are connected in series between the inverter circuit 20 and the output DC voltage circuit 4. The filter capacitors 32 which are connected by delta-connection are connected to the output DC voltage circuit 4 sides of the filter reactors 31. The output DC voltage circuit 4 includes three batteries 4a, and the batteries 4a are provided, for the respective phases, between the AC power supply system 5 and the filter reactors 31 of the sine wave filter 30 connected to the AC output side of the inverter circuit 20, such that the positive electrodes of the batteries 4a are connected to the filter reactors 31.

The difference from conventional power conditioners for photovoltaic power generation is that the output DC voltage circuit 4 is connected in series between the inverter circuit 20 and the AC power supply system 5. Here, the voltages of the batteries 4a are set at the same value, so that line-to-line voltages are not influenced by the connection of the output DC voltage circuit 4.

Next, operations will be described. The step-up chopper circuit 10, the inverter circuit 20, the sine wave filter 30 are the same as conventional ones, and therefore, the detailed description of the circuit operations thereof is omitted here. Here, the voltage of the DC capacitor 28, which is the predetermined voltage of the DC power, is defined as 2 E (V). If the voltage of the output DC voltage circuit 4, i.e., the voltage of each battery 4a is 0 (V), effect due to the connection does not occur and the neutral point voltage of the AC power supply system 5 is almost equal to the DC neutral point voltage of the inverter circuit 20, i.e., E (V). As a result, the voltage of the equivalent capacitor 3 having the floating capacitance Cs between the solar battery 1 and the ground (the voltage of the negative electrode N as seen from the ground) is –E (V). For example, if the voltages of the batteries 4a are set at E (V) which is ½ of the predetermined voltage of 2 E (V), phase voltages for the respective phases are biased by E (V), whereby each phase voltage decreases by E (V). However, as described above, the line-to-line voltages are not influenced. The neutral point voltage of the AC power supply system 5 also decreases by E (V), to be 0 (V). As a result, the voltage of the equivalent capacitor 3 also becomes 0 (V).

As described above, if the voltages of the batteries 4a are set at E (V), the voltage of the equivalent capacitor 3 also becomes 0 (V). In consideration of some margin, the voltages of the batteries 4a are set at E+a (V). If the voltages of the batteries 4a are set at E+a (V), the phase voltages for the respective phases decrease by E+a (V), and the neutral point voltage of the power supply system also decreases by E+a (V), to be –a (V). As a result, the voltage of the floating capacitance Cs is +a (V). In this way, by changing the voltages of the batteries 4a, it is possible to arbitrarily set the voltage of the floating capacitance Cs between the solar battery 1 and the ground. It is noted that in the present embodiment, for example, if the voltage of the AC power supply system 5 is set at 220 (V), E is set at 180 (V) (DC), and a is set at about 10 (V).

As described above, even in the case where a solar battery of thin-film type is used as the solar battery 1, and the solar battery 1 is applied to a non-isolated system, if bias voltages equal to or larger than ½ of the predetermined voltage of 2 E (V), i.e., equal to or larger than E (V) are applied by the batteries 4a, the negative electrode N of the solar battery 1 is not negatively biased, that is, the negative electrode N of the solar battery 1 does not have a negative potential, but the negative electrode N can be set at 0 (V) or positively biased. Then, the acceleration of the deterioration of the solar battery of thin-film type can be restricted. In addition, since it is not necessary to provide an output transformer before the AC power supply system in order to isolate the solar battery and the AC power supply system from each other, power loss in the output transformer can be eliminated, and therefore, power loss of the whole apparatus can be reduced.

Embodiment 2

Figure 2:
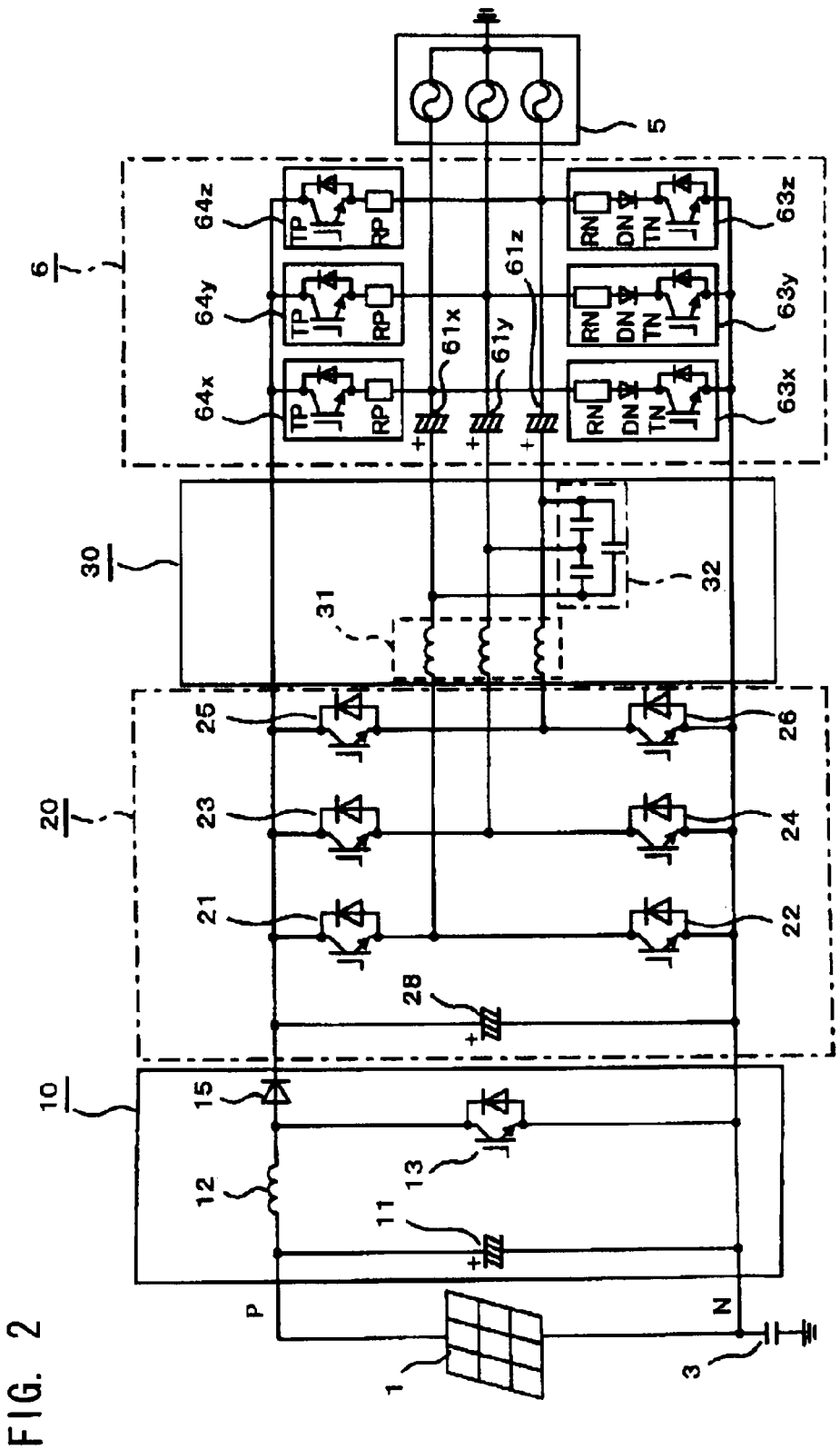
FIG. 2 is a diagram showing the configuration of a power conditioner for photovoltaic power generation according to embodiment 2 of the present invention.
Figure 3:
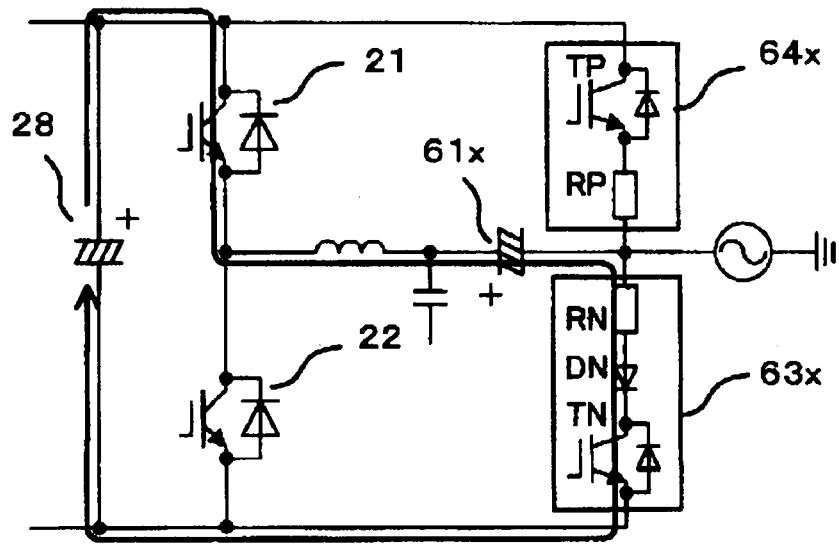
FIG. 3 is a circuit diagram for one phase for explaining charge/discharge operation of an output DC voltage circuit shown in FIG. 2.

FIGS. 2 and 3 show embodiment 2. FIG. 2 is a diagram showing the configuration of a power conditioner for photovoltaic power generation, and FIGS. 3 to 6 are circuit diagrams for one phase (X-phase) for explaining charge/discharge operation. Although in embodiment 1, the case where the batteries 4a are connected in series has been described, capacitors may be used instead of the batteries 4a. Charge/discharge circuits for controlling the DC voltages of the capacitors are needed for the capacitors. With reference to FIG. 2, an output DC voltage circuit 6 includes: output capacitors 61x to 61z in place of the batteries 4a shown in FIG. 1; and charge circuits 63x to 63z and discharge circuits 64x to 64z for the output capacitors 61x to 61z for the respective phases. The output capacitors 61x to 61z are provided, for the respective phases, between the AC power supply system 5 and the filter reactors 31 of the sine wave filter 30 connected to the AC output side of the inverter circuit 20, such that the positive electrodes of the output capacitors 61x to 61z are connected to the filter reactors 31.

Each of the charge circuits 63x to 63z includes an IGBT device TN, a diode DN, and a current-limiting resistor RN. The charge circuits 63x to 63z are connected between the respective negative terminals of the output capacitors 61x to 61z and the negative terminal of the DC capacitor 28. In addition, each of the discharge circuits 64x to 64z includes an IGBT device TP and a current-limiting resistor RP. The discharge circuits 64x to 64z are connected between the positive terminal of the DC capacitor 28 and the respective negative terminals of the output capacitors 61x to 61z. The other components are the same as those of embodiment 1 shown in FIG. 1. Therefore, the other components are denoted by the same reference numerals as in embodiment 1, and the description thereof is omitted.

Next, charge/discharge operation of the output capacitors 61x to 61z will be described.

FIGS. 3 to 6 are circuit diagrams for one phase (X-phase) for explaining the charge/discharge operation. The operation will be described focusing on the X-phase. The IGBT device 21 and the IGBT device 22 which are the components of the inverter circuit are alternately turned on and off in accordance with, for example, pulse width modulation. On the other hand, the IGBT device TN of the charge circuit 63x and the IGBT device TP of the discharge circuit 64x are turned on and off in accordance with a charge instruction and a discharge instruction, respectively. In the case where the output capacitor 61x is to be charged (operation mode 1), as shown in FIG. 3, the IGBT device TN of the charge circuit 63x is turned on. During a time when the IGBT device 21 of the inverter circuit 20 is ON, the output capacitor 61x is charged by the DC capacitor 28. The charge current is restricted by the current-limiting resistor RN of the charge circuit 63x.

Figure 4:
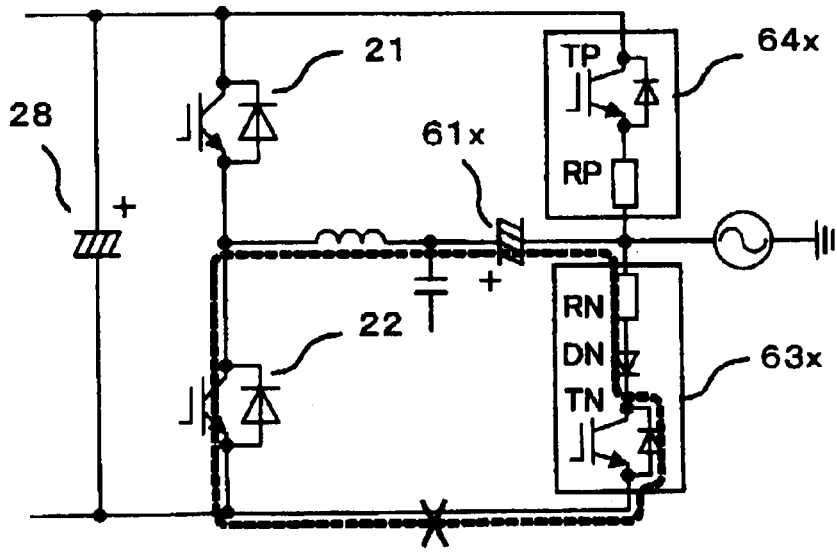
FIG. 4 is a circuit diagram for one phase for explaining charge/discharge operation of the output DC voltage circuit shown in FIG. 2.
Figure 5:
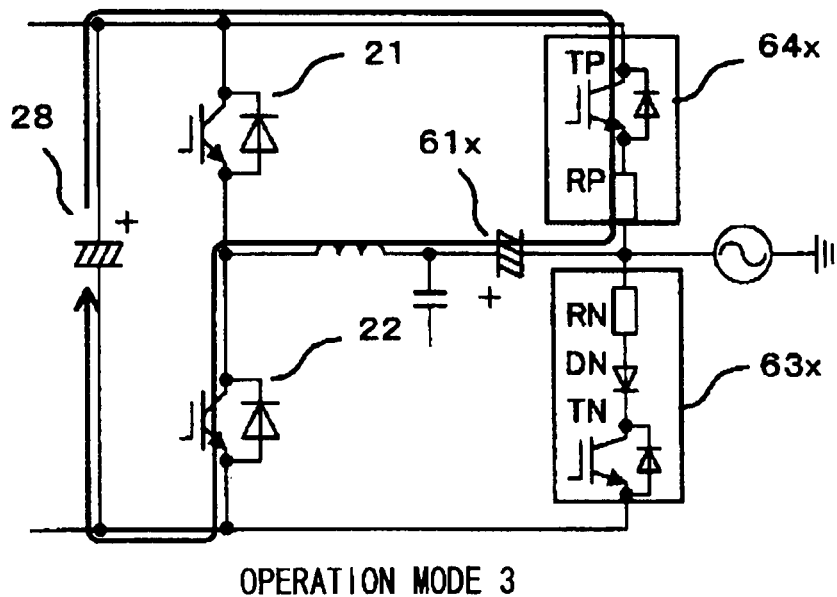
FIG. 5 is a circuit diagram for one phase for explaining charge/discharge operation of the output DC voltage circuit shown in FIG. 2.
Figure 6:
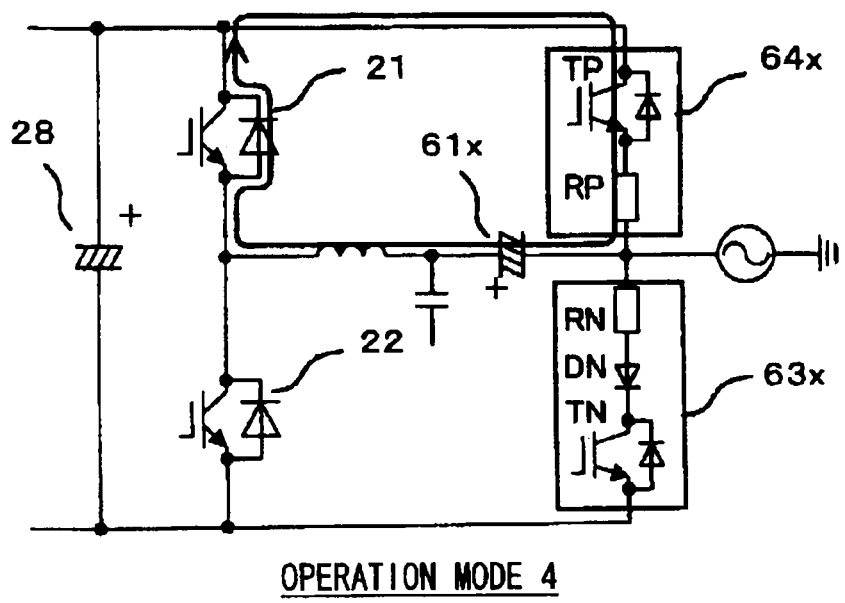
FIG. 6 is a circuit diagram for one phase for explaining charge/discharge operation of the output DC voltage circuit shown in FIG. 2.

On the other hand, during a time when the IGBT device 22 of the inverter circuit 20 is ON (operation mode 2), a current is to flow as shown in FIG. 4, but the current is blocked by the diode DN of the charge circuit 63x and cannot flow. Therefore, the output capacitor 61x is neither charged nor discharged. The diode DN of the charge circuit 63x has a function of inhibiting discharge of the output capacitor 61x during a time when the IGBT device 22 is ON. In the case where the output capacitor 61x is discharged (operation mode 3 or 4), as shown in FIGS. 5 and 6, the IGBT device TP of the discharge circuit 64x is turned on. When the IGBT device TP of the discharge circuit 64x is ON, a discharge current route for the output capacitor 61x is created during both a time when the IGBT device 21 of the inverter circuit 20 is ON and a time when the IGBT device 22 of the inverter circuit 20 is ON. The discharge current is restricted by the current-limiting resistor RP of the discharge circuit 64x.

In the case where the voltage of the DC capacitor 28 is 2 E (V), ON/OFF control is performed for the IGBT device TN of the charge circuit 63x and the IGBT device TP of the discharge circuit 64x, with a voltage instruction value for the output capacitor 61x set at E (V). As a result, the voltage of the equivalent capacitor 3 having the floating capacitance Cs between the solar battery 1 and the ground is 0 (V). In addition, if the voltage instruction value is set at E+a (V), the voltage of the equivalent capacitor 3 is a (V). That is, by changing the voltage instruction value for the output capacitor 61x, it is possible to arbitrarily set the voltage of the equivalent capacitor 3 between the solar battery 1 and the ground. Therefore, even in the case where a solar battery of thin-film type is used as the solar battery 1, and the solar battery 1 is applied to a non-isolated system, the negative electrode N of the solar battery 1 is not biased so as to have a negative potential, but the negative electrode N can be set at 0 (V) or positively biased. That is, if a bias voltage equal to or larger than ½ of the predetermined voltage of 2 E (V), i.e., equal to or larger than E (V) is applied, the acceleration of the deterioration of the solar battery of thin-film type can be restricted.

It is noted that depending on practical use of the system, the voltage of the DC capacitor 28 can be changed during operation of the power conditioner for photovoltaic power generation. At this time, the voltages of the output capacitors 61x to 61z are changed in accordance with the voltage of the DC capacitor 28. If the voltage of the DC capacitor 28 is increased, the output capacitors 61x to 61z are charged by the charge circuits 63x to 63z, respectively, and if the voltage of the DC capacitor 28 is decreased, the output capacitors 61x to 61z are discharged by the discharge circuits 64x to 64z, respectively. In this way, the voltages of the output capacitors 61x to 61z are changed.

Embodiment 3

Figure 7:
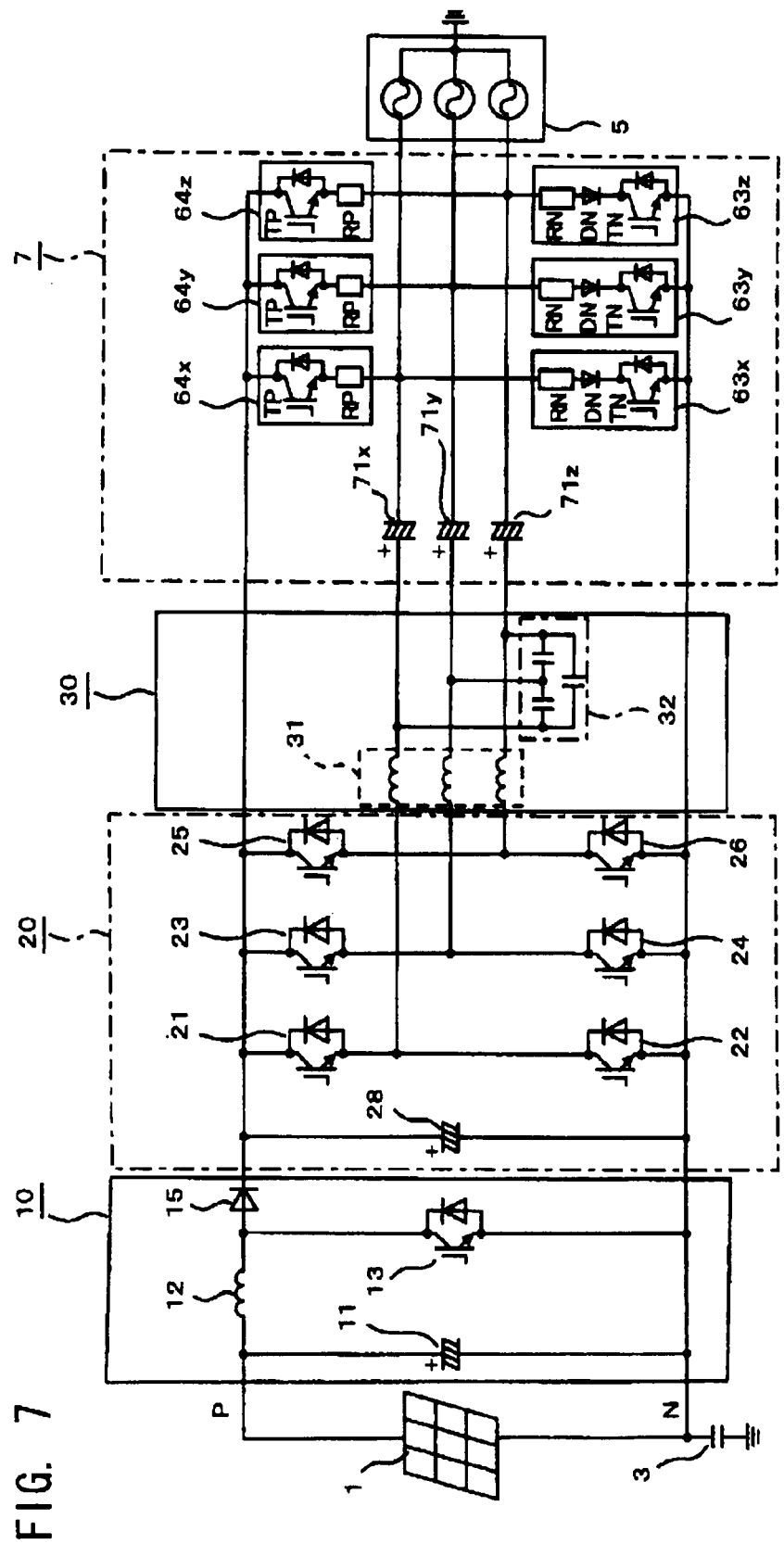
FIG. 7 is a diagram showing the configuration of a power conditioner for photovoltaic power generation according to embodiment 3 of the present invention.

FIG. 7 is a diagram showing the configuration of a power conditioner for photovoltaic power generation according to embodiment 3. With reference to FIG. 7, output capacitors 71x to 71z, whose impedances are set at 5% of the impedance of the AC power supply system 5, are provided, for the respective phases, between the AC power supply system 5 and the filter reactors 31 of the sine wave filter 30, such that the positive electrodes of the output capacitors 71x to 71z are connected to the filter reactors 31. The other components are the same as those of embodiment 2 shown in FIG. 2. Therefore, the other components are denoted by the same reference numerals as in embodiment 2, and the description thereof is omitted. Since output currents flow in the output capacitors 71x to 71z, the terminal voltages of the output capacitors 71x to 71z vary. In addition, in the case of three-phase AC, there are phase differences among the variations in the terminal voltages. Ideally, it is desired that the variations in the terminal voltages of the output capacitors 71x to 71z are 0 (V). Therefore, in actual power conditioners for photovoltaic power generation, it is desired that the impedances of the output capacitors 71x to 71z are made as small as possible. Specifically, 5% or less is appropriate as the impedances of the output capacitors 71x to 71z. Therefore, in the present embodiment, electrolytic capacitors having large capacitances are used, and the impedances thereof are set at 5% of the impedance of the AC power supply system 5.

If the three-phase AC power supply system voltage is 220 (v) and the rated current is 50 A, the 5% impedance is as follows.

220V/√3/50 A×5%=127 mΩ

If the AC power supply system frequency is 60 (Hz), the capacitances of the output capacitors 71x to 71z are as follows.

1/(127 mΩ×2×π×60 Hz)=21 mF

Embodiment 4

Figure 8:
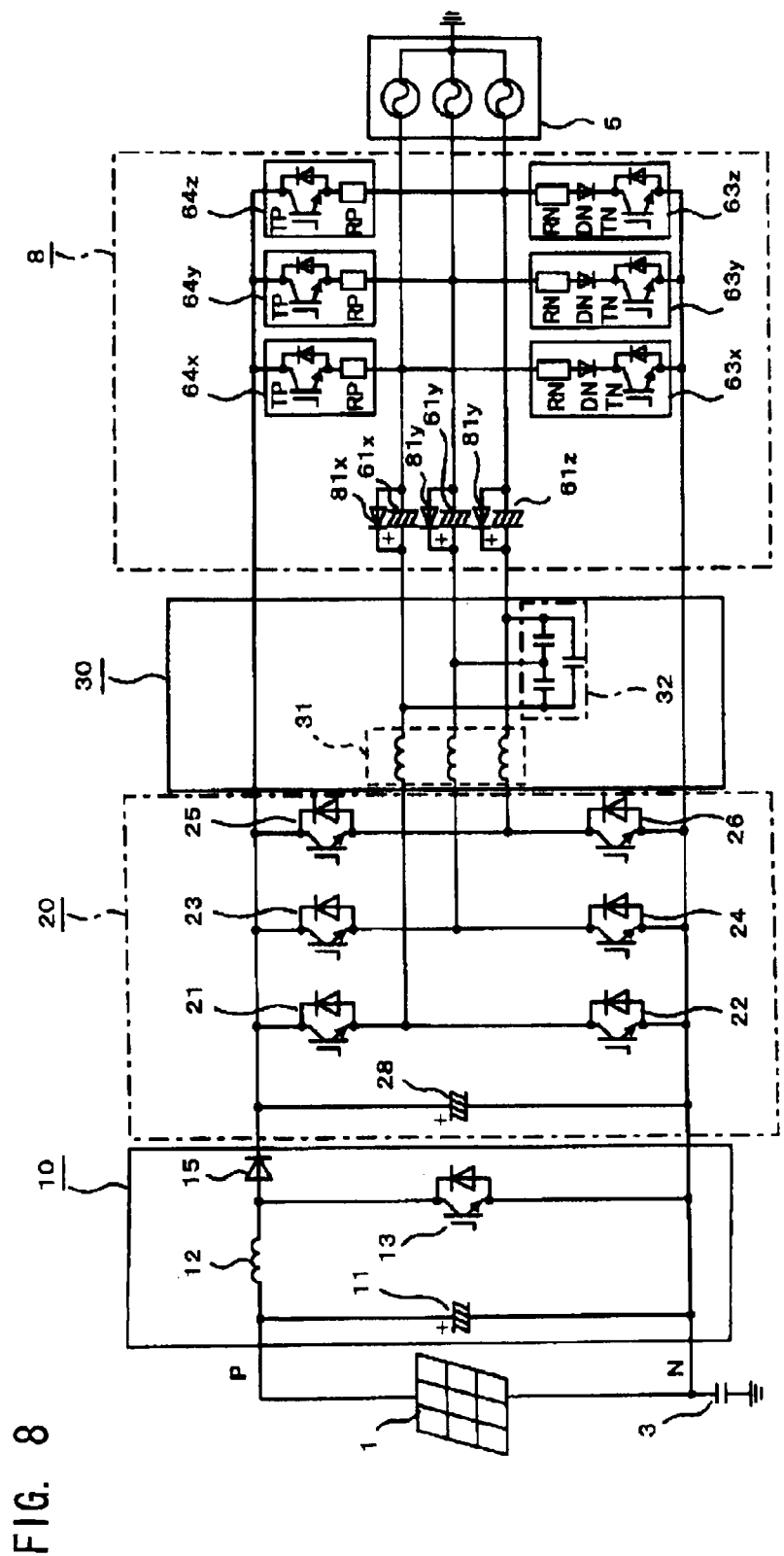
FIG. 8 is a diagram showing the configuration of a power conditioner for photovoltaic power generation according to embodiment 4 of the present invention.

FIG. 8 is a diagram showing the configuration of a power conditioner for photovoltaic power generation according to embodiment 4. With reference to FIG. 8, diodes 81x to 81z are connected in antiparallel to the output capacitors 71x to 71z, respectively, that is, the diodes 81x to 81z are connected in parallel to the output capacitors 71x to 71z such that the cathodes of the diodes 81x to 81z are connected to the positive electrodes of the output capacitors 71x to 71z. The other components are the same as those of embodiment 3 shown in FIG. 7. Therefore, the other components are denoted by the same reference numerals as in embodiment 3, and the description thereof is omitted. Electrolytic capacitors are used as the output capacitors 71x to 71z. The electrolytic capacitors are broken if they are charged in the reverse direction. Therefore, it is necessary to take some measure so as not to cause reverse charge in any condition. As a specific measure for preventing reverse charge, the output capacitors 71x to 71z which are electrolytic capacitors are connected in antiparallel to the diodes 81x to 81z, respectively.

Embodiment 5

Figure 9:
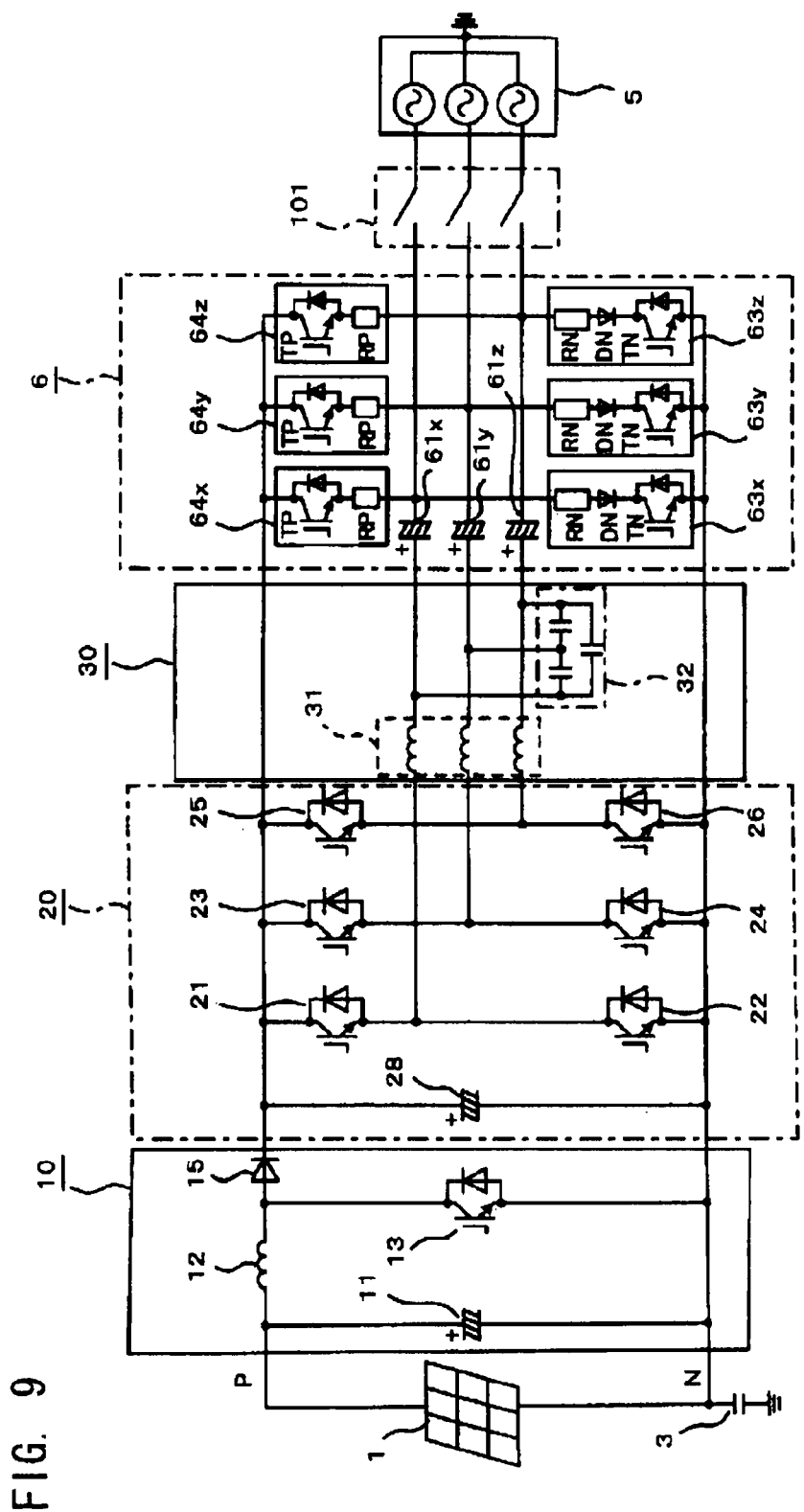
FIG. 9 is a diagram showing the configuration of a power conditioner for photovoltaic power generation according to embodiment 5 of the present invention.

FIG. 9 is a diagram showing the configuration of a power conditioner for photovoltaic power generation according to embodiment 5. With reference to FIG. 9, in actual power conditioners for photovoltaic power generation, coordination switches 101 are provided between the inverter circuit 20 and the AC power supply system 5. The other components are the same as those of embodiment 2 shown in FIG. 2. Therefore, the other components are denoted by the same reference numerals as in embodiment 2, and the description thereof is omitted. The coordination switches 101 are closed at the time when preparations for connecting the inverter circuit 20 to the AC power supply system 5 have been made. That is, at the time when the output capacitors 61x to 61z have been initially charged and the voltages of the output capacitors 61x to 61z have become equal to or larger than a predetermined value, the coordination switches 101 are closed, and the solar battery 1 is coordinated with the AC power supply system 5 via the inverter circuit 20.

If the coordination switches 101 are closed in the state in which the voltages of the output capacitors 61x to 61z are 0 (V) or extremely low, and an AC current starts to flow from the inverter circuit 20, there is a possibility that the output capacitors 61x to 61z are transiently reversely charged. Therefore, it is desired that after the output capacitors 61x to 61z are initially charged to a predetermined voltage, the coordination switches 101 are closed and an AC current starts to flow from the inverter circuit 20. When the output capacitors 61x to 61z are initially charged, the IGBT devices 21, 23, 25 and the charge circuits 63x to 63z are turned on as follows.

Output capacitor 61x for U-phase: IGBT device 21 and charge circuit 63x

Output capacitor 61y for V-phase: IGBT device 23 and charge circuit 63y

Output capacitor 61z for W-phase: IGBT device 25 and charge circuit 63z

Regarding the initial charge voltage, if the voltage of the solar battery 1, that is, the voltage of the DC capacitor 28 is 2E (V), a target voltage for the output capacitors 61x to 61z in the initial charge is set at, for example, E (V) which is half of 2E (V). When the voltages of the output capacitors 61x to 61z have become equal to or larger than ½ of the voltage of DC power outputted from the solar battery, the coordination switches 101 are closed. In this way, the output capacitors 61x to 61z are prevented from being transiently reversely charged.

Embodiment 6

Figure 10:
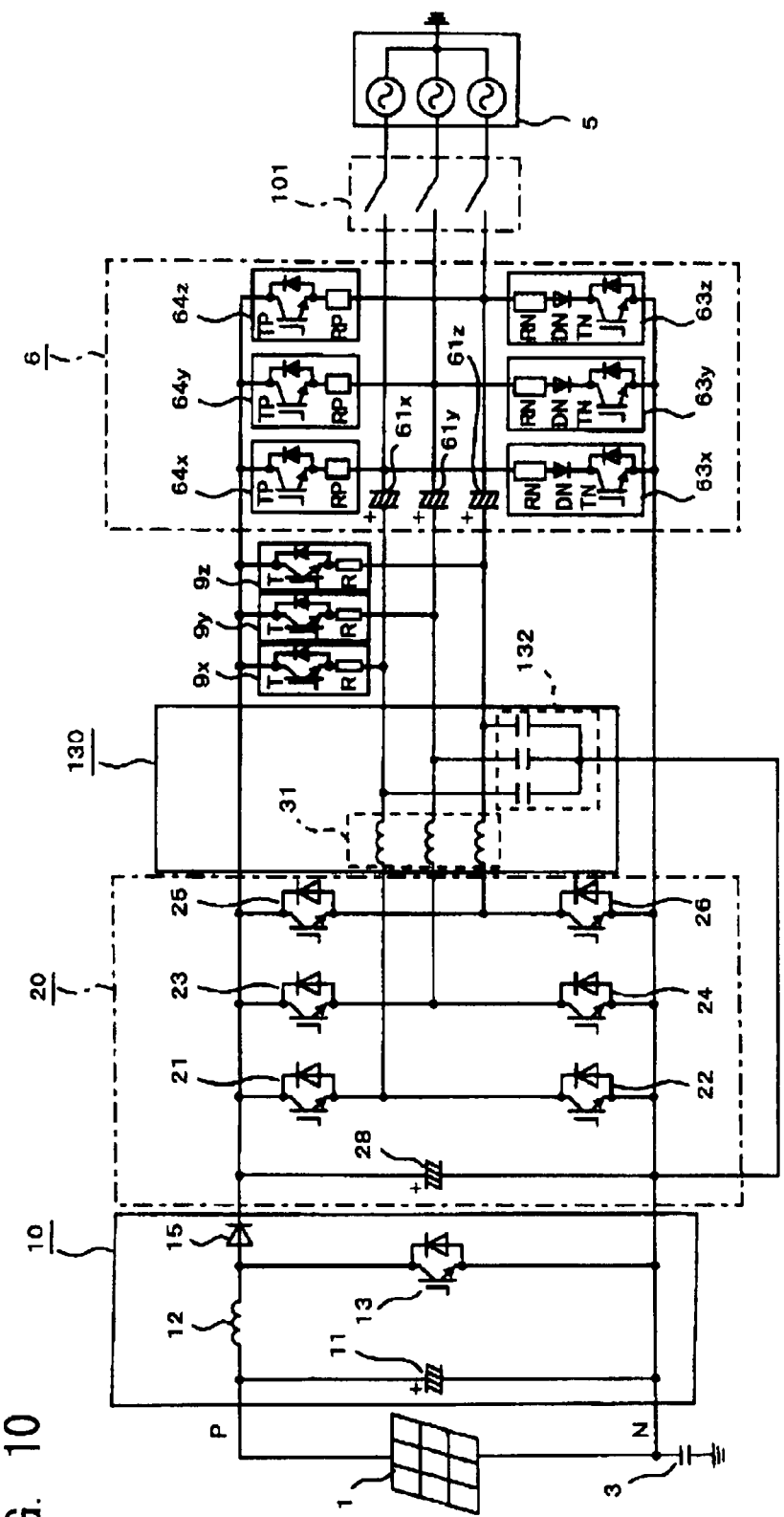
FIG. 10 is a diagram showing the configuration of a power conditioner for photovoltaic power generation according to embodiment 6 of the present invention.

FIG. 10 is a diagram showing the configuration of a power conditioner for photovoltaic power generation according to embodiment 6. With reference to FIG. 10, a sine wave filter 130 includes filter capacitors 132, the filter capacitors 132 are connected by star-connection, and the common connection point thereamong is connected to the negative terminal of the DC capacitor 28 (the negative electrode N of the solar battery 1). In addition, charge circuits 9x to 9z are connected between the positive terminal of the DC capacitor 28 (the positive electrode P of the solar battery 1), and the positive terminals of the output capacitors 61x to 61z, respectively. It is noted that each of the charge circuits 9x to 9z includes an IGBT device T and a current-limiting resistor R connected in series. The other components are the same as those of embodiment 5 shown in FIG. 9. Therefore, the other components are denoted by the same reference numerals as in embodiment 5, and the description thereof is omitted.

Here, if the IGBT device 21 and the charge circuit 63x are turned on in order to initially charge the output capacitor 61x for U-phase, the filter capacitor 132 is also charged through a route from the DC capacitor 28, through the IGBT device 21, the filter reactor 31, and then the filter capacitor 132, to the DC capacitor 28. However, the peak value of the charge current can reach the overcurrent level of the inverter circuit 20, and the current and the voltage successively fluctuate. This is not preferred for the circuit operation. In the case where the filter capacitors 132 of the sine wave filter 130 are connected by star-connection as described above, as a measure against the above problem, the charge circuits 9x to 9z for initial charge are additionally connected, whereby the above problem can be avoided. In this case, when the output capacitor 61x for U-phase is initially charged, the charge circuit 9x and the charge circuit 63x are turned on. The charge current for the output capacitor 61x for U-phase is limited to a safety value by the current-limiting resistor R of the charge circuit 9x and the current-limiting resistor RN of the charge circuit 63x. In addition, although the filter capacitor 132 is charged by the charge circuit 9x being turned on, the charge current for the charge filter capacitor 132 is also limited to a safety value by the current-limiting resistor R of the charge circuit 9x.

Embodiment 7

Figure 11:
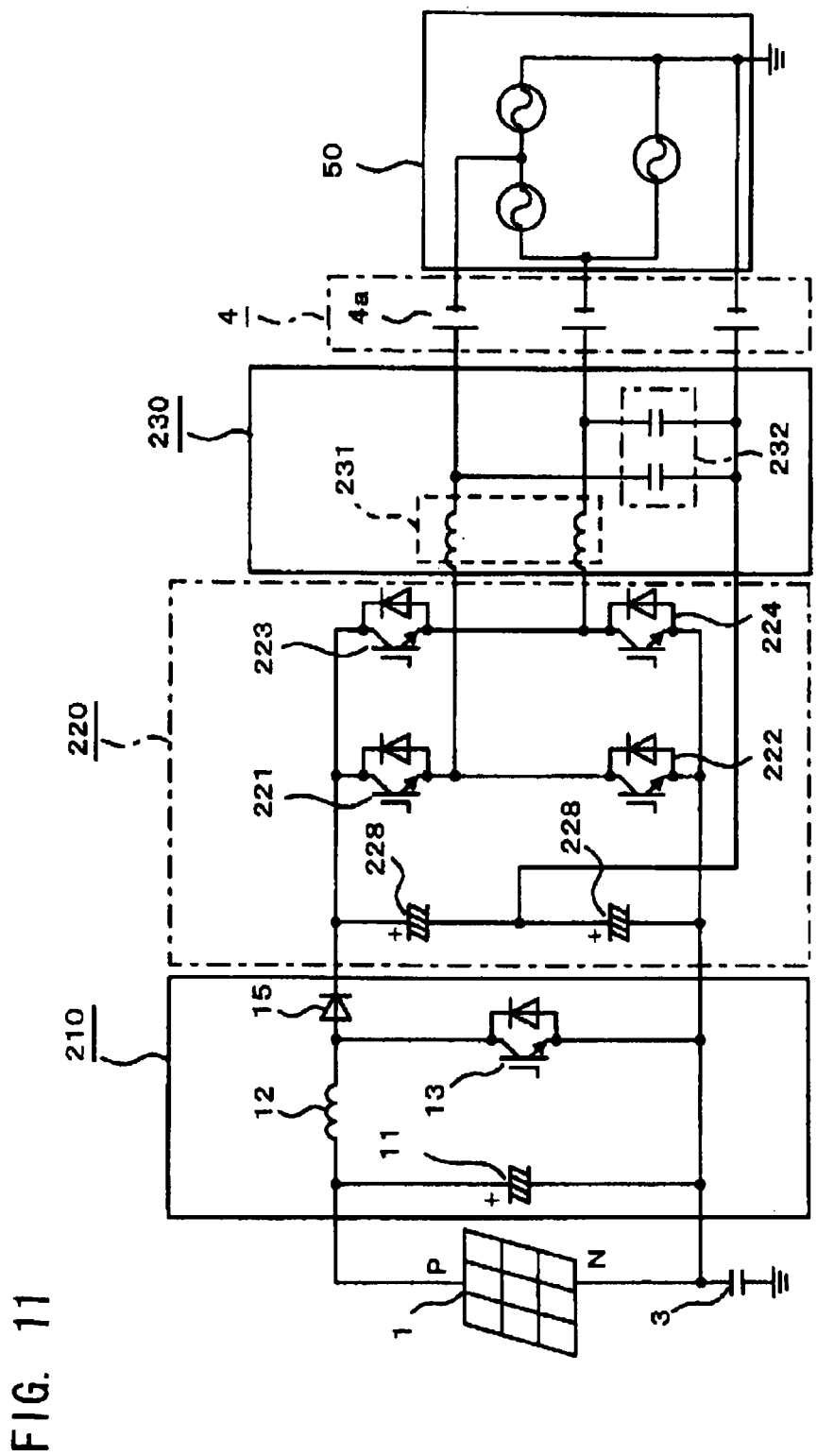
FIG. 11 is a diagram showing the configuration of a power conditioner for photovoltaic power generation according to embodiment 7 of the present invention.

FIG. 11 is a diagram showing the configuration of a power conditioner for photovoltaic power generation according to embodiment 7. In the AC power supply systems 5 of the above-described embodiments, the three phases are connected by star-connection and the neutral point is grounded. Besides the above configuration, the three phases may be connected by delta-connection, and one of the three phases, for example, the V-phase may be grounded. Also in this case, the same problem as described above arises. In the present embodiment, the present invention is applied to such a case. With reference to FIG. 11, DC power generated by the solar battery 1 is stepped up to the predetermined DC voltage of E (V), by a step-up chopper circuit 210. The DC power that has been stepped up is converted into three-phase AC power by an inverter circuit 220. The three-phase AC power is sent to an AC power supply system 50 via a sine wave filter 230 and the output DC voltage circuit 4. The solar battery 1 is not grounded, and the negative electrode N of the solar battery 1 is grounded via the equivalent capacitor 3 having the floating capacitance Cs between the negative electrode N and the ground. The AC power supply system 50 is a three-phase delta-connection AC power supply system in which power supplies for three phases are connected by delta-connection, and the V-phase of the three phases is grounded.

It is noted that the step-up chopper circuit 210 includes the input capacitor 11, the step-up reactor 12, the IGBT device 13, and the diode device 15. The inverter circuit 220 is a single-phase 2-level inverter circuit including: IGBT devices 221 to 224 as switching devices, connected as a single-phase full-wave bridge circuit; and DC capacitors 228. The two DC capacitors 228, which are connected in series, are connected between the cathode of the diode device 15 and the negative electrode N of the solar battery 1. The sine wave filter 230 includes filter reactors 231 and filter capacitors 232. The filter reactors 231 are connected in series between the inverter circuit 220 and the output DC voltage circuit 4. The filter capacitors 232 are connected between the output DC voltage circuit 4 sides of the filter reactors 231, and the negative electrode N of the solar battery 1. The output DC voltage circuit 4 includes the three batteries 4a, and the batteries 4a are provided between the AC power supply system 50 and the filter reactors 231 of the sine wave filter 230, and between the AC power supply system 50 and the connection point between the two DC capacitors 228 of the inverter circuit 220.

In the case where the voltages of the DC capacitors 228 are E (V), if the voltages of the batteries 4a are set at E (V), the voltage of the equivalent capacitor 3 having the floating capacitance Cs between the solar battery 1 and the ground is 0 (V). Therefore, the same effect as in the above embodiments is provided.

It is noted that the step-up chopper circuits and the inverter circuits of the above embodiments may have other configurations.

The invention claimed is:

1. A power conditioner for photovoltaic power generation in which a solar battery is connected, not via isolating means, to an AC power supply system that is grounded, the power conditioner for photovoltaic power generation comprising:
    a power conversion apparatus for converting DC power generated by the solar battery into AC power; and
    a bias application apparatus for applying a bias voltage to the solar battery such that a negative electrode of the solar battery does not have a negative potential, the bias application apparatus being provided in series between the power conversion apparatus and the AC power supply system.

2. The power conditioner for photovoltaic power generation according to claim 1, wherein the solar battery is a solar battery of thin-film type.

3. The power conditioner for photovoltaic power generation according to claim 1, wherein the bias application apparatus applies a bias voltage equal to or larger than ½ of the voltage of the DC power.

4. The power conditioner for photovoltaic power generation according to claim 1, wherein
    the bias application apparatus includes capacitors and charge circuits,
    the capacitors are provided in series between the power conversion apparatus and the AC power supply system, and
    the charge circuits charge the capacitors with the DC power, thereby applying the bias voltage.

5. The power conditioner for photovoltaic power generation according to claim 4, wherein the impedance of the capacitors is equal to or smaller than 5% of the rated impedance of the power conversion apparatus.

6. The power conditioner for photovoltaic power generation according to claim 4, further comprising a diodes, wherein
    the capacitors are electrolytic capacitors, and
    the diodes are connected in parallel to the electrolytic capacitors such that the cathodes of the diodes are connected to positive electrodes of the electrolytic capacitors.

7. The power conditioner for photovoltaic power generation according to claim 1, further comprising a coordination switch, wherein
    the coordination switch is provided between the bias application apparatus and the AC power supply system, and is closed when the output voltage of the bias application apparatus is equal to or larger than ½ of the voltage of the DC power.

8. The power conditioner for photovoltaic power generation according to claim 1, wherein the AC power supply system is a three-phase star-connection AC power supply system in which power supplies for three phases are connected by star-connection and a neutral point is grounded.

9. The power conditioner for photovoltaic power generation according to claim 1, wherein the AC power supply system is a three-phase delta-connection AC power supply system in which power supplies for three phases are connected by delta-connection and one of the three phases is grounded.

* * * * *